US005623159A

United States Patent [19]
Monk et al.

[11] Patent Number: 5,623,159
[45] Date of Patent: Apr. 22, 1997

[54] INTEGRATED CIRCUIT ISOLATION STRUCTURE FOR SUPPRESSING HIGH-FREQUENCY CROSS-TALK

[75] Inventors: David J. Monk, Gilbert; Kuntal Joardar, Chandler, both of Ariz.

[73] Assignee: Motorola, Inc., Schaumburg, Ill.

[21] Appl. No.: 625,685

[22] Filed: Apr. 4, 1996

Related U.S. Application Data

[63] Continuation of Ser. No. 317,078, Oct. 3, 1994, abandoned.

[51] Int. Cl.⁶ .................................................. H01L 27/04
[52] U.S. Cl. .......................... 257/509; 257/500; 257/544; 257/549; 257/550; 257/547; 257/929
[58] Field of Search ..................................... 257/509, 500, 257/544, 549, 550, 547, 548, 929, 502

[56] References Cited

U.S. PATENT DOCUMENTS

| | | | |
|---|---|---|---|
| 3,912,555 | 10/1975 | Tsuyuki | 257/549 |
| 4,110,782 | 8/1978 | Nelson et al. | 257/502 |
| 5,070,382 | 12/1991 | Cambou | 257/502 |
| 5,220,190 | 6/1993 | Taguchi et al. | 257/544 |
| 5,268,312 | 12/1993 | Reuss et al. | 437/30 |
| 5,293,060 | 3/1994 | Komori et al. | 257/544 |
| 5,336,915 | 8/1994 | Fujita et al. | 257/500 |
| 5,394,007 | 2/1995 | Reuss et al. | 257/544 |

*Primary Examiner*—Sara W. Crane
*Assistant Examiner*—David B. Hardy
*Attorney, Agent, or Firm*—Bruce T. Neel

[57] ABSTRACT

An improved isolation structure for a semiconductor device includes a p-type semiconductor substrate (12) with a p-type well (28) disposed in the substrate (12). A continuous plurality of n-type regions (14, 16, 26) is disposed around the p-type well (28), and the continuous plurality of n-type regions (14, 16, 26) fully isolates the p-type well (28) from the substrate (12) except that the continuous plurality of regions (14, 16, 26) comprises one or more p-type gaps (18) that electrically connect the p-type well (28) to the p-type substrate (12). The use of the gap (18) improves cross-talk suppression in mixed-mode integrated circuits at higher frequencies, for example greater than 50 MHz.

17 Claims, 2 Drawing Sheets

INTEGRATED CIRCUIT ISOLATION STRUCTURE FOR SUPPRESSING HIGH-FREQUENCY CROSS-TALK

This application is a continuation of prior application Ser. No. 08/317,078, filed Oct. 3, 1994, now abandoned.

BACKGROUND OF THE INVENTION

The present invention relates, in general, to semiconductor devices and, more particularly, to an isolation structure for a semiconductor device.

Mixed-mode integrated circuits (ICs) combine digital and analog devices on a single semiconductor substrate. One of the most significant problems faced when combining such devices is noise coupling from one device to another through the common substrate in which the devices are formed (this noise coupling is also hereinafter referred to as "cross-talk"). Because all components of the IC are formed in a common conductive substrate, any noise introduced into the substrate by one component is transmitted to the other components through the substrate. Thus, for example, sensitive analog elements on a mixed-mode IC are vulnerable to malfunction due to their placement on the common substrate adjacent to noise-generating digital devices. Moreover, as mixed-mode ICs continue to combine an increasing variety of device types onto a single substrate and use smaller geometry linewidths, the problem of cross-talk becomes even more severe.

Several techniques have been used in the past to limit cross-talk. One prior approach described by Reuss et al. in U.S. Pat. No. 5,268,312 (entitled "METHOD OF FORMING ISOLATED WELLS IN THE FABRICATION OF BICMOS DEVICES", issued Dec. 7, 1993, having a common inventor with the present application, and commonly assigned to Motorola, Inc.), which is hereby incorporated by reference in full, uses fully isolated wells to minimize cross-talk in bipolar-complementary metal oxide semiconductor (BiCMOS) ICs. Simply stated, this prior approach isolates p-type wells (p-wells) from the substrate by fully surrounding each p-well by a continuous n-type region. One problem, however, is that the isolation provided by such a fully-isolated well decreases in effectiveness at higher frequencies, for example greater than 50 MHz. For circuits operating at these higher frequencies, an improved structure providing further reduction in cross-talk than possible with a fully-isolated well is desirable.

Another limitation of a fully-isolated well is the need for a separate internal contact for each well. Because a fully-isolated well is completely isolated from the substrate, an internal contact is required for each well. These internal contacts are used to tie the wells to ground or another appropriate bias voltage as needed for electrical isolation, but these internal contacts often require additional layout area on the IC.

Accordingly, there is a need for an improved isolation structure for an IC that provides improved reduction in cross-talk between noise-generating devices and noise-sensitive devices at higher frequencies and that does not require an internal contact for each isolation well.

DETAILED DESCRIPTION OF THE DRAWINGS

Briefly stated, the present invention provides an improved isolation structure for a semiconductor device comprising a p-type semiconductor substrate and a p-well disposed in the substrate. A continuous plurality of n-type regions is disposed around the p-well, and the continuous plurality of n-type regions fully isolates the p-well from the substrate except that the continuous plurality of regions comprises one or more p-type gaps that connect the p-well to the p-type substrate.

Generally, each gap is preferably defined to have a width about equal to the minimum attainable with the particular processing technology selected for fabrication of the device. However, each gap is made sufficiently large so as to provide an electrical connection between the p-well and the substrate, but sufficiently small that the p-well is substantially fully-surrounded by the plurality of n-type regions. Although the present invention is described herein with reference to an isolated p-well disposed in a p-type substrate, one of skill in the art will appreciate that the present invention is also applicable to and includes an isolated n-type well disposed in an n-type substrate. For an embodiment having an isolated n-type well, the conductivity types discussed herein would be selected to be of an opposite type from that described for the embodiment set forth below.

The present invention can be more fully described with reference to FIGS. 1–4. The isolation structure according to the present invention may be fabricated using substantially similar steps as those described by Reuss et al. in U.S. Pat. No. 5,268,312 (entitled "METHOD OF FORMING ISOLATED WELLS IN THE FABRICATION OF BICMOS DEVICES", issued Dec. 7, 1993), and this patent is incorporated by reference in full for at least its teachings regarding fabrication. The necessary modifications to these steps are substantially described below.

Figure 1:
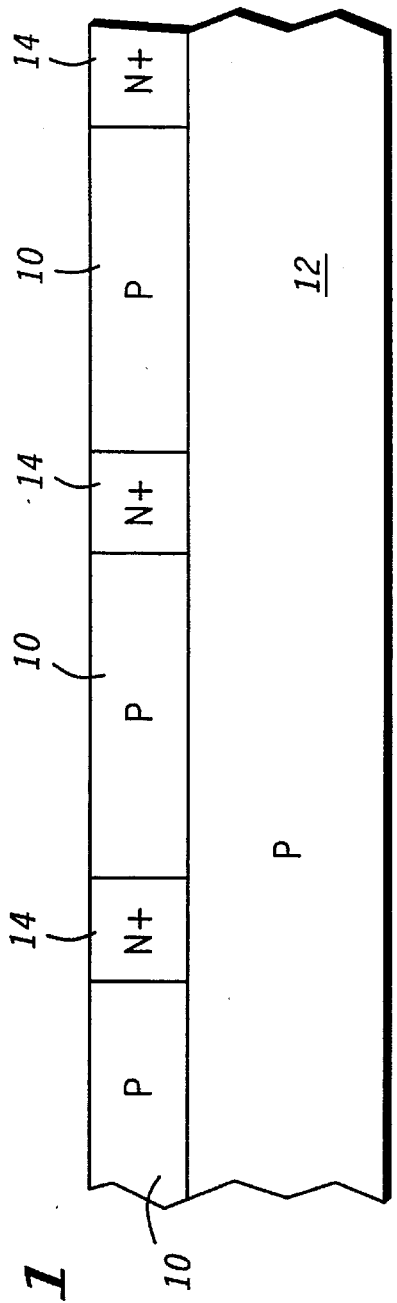
FIGS. 1–4 illustrate sequential stages in the manufacture of an isolation structure for a semiconductor device according to the present invention.

FIG. 1 is an enlarged, cross-sectional illustration of an early stage of fabrication of an isolation structure according to the present invention. Heavily-doped n-type annular buried isolation regions 14 have been formed in a p-type semiconductor substrate 12, and a p-type buried layer 10 has been formed in substrate 12 by doping those surface regions not doped by isolation regions 14. Substrate 12 may be silicon, and isolation regions 14 may be formed by ion implantation of arsenic (for example, of about $8 \times 10^{15}$ atoms/cm$^2$ at 60 KeV) in selected areas of substrate 12. After forming isolation regions 14, buried layer 10 may be formed by ion implantation of boron (for example, of about $5 \times 10^{13}$ atoms/cm$^2$ at 60 KeV) into those areas not implanted with arsenic. The p-type regions of buried layer 10 are preferably formed to be self-aligned with isolation regions 14 as described further by Reuss et al. in U.S. Pat. No. 5,268,312, cited above.

Figure 2:
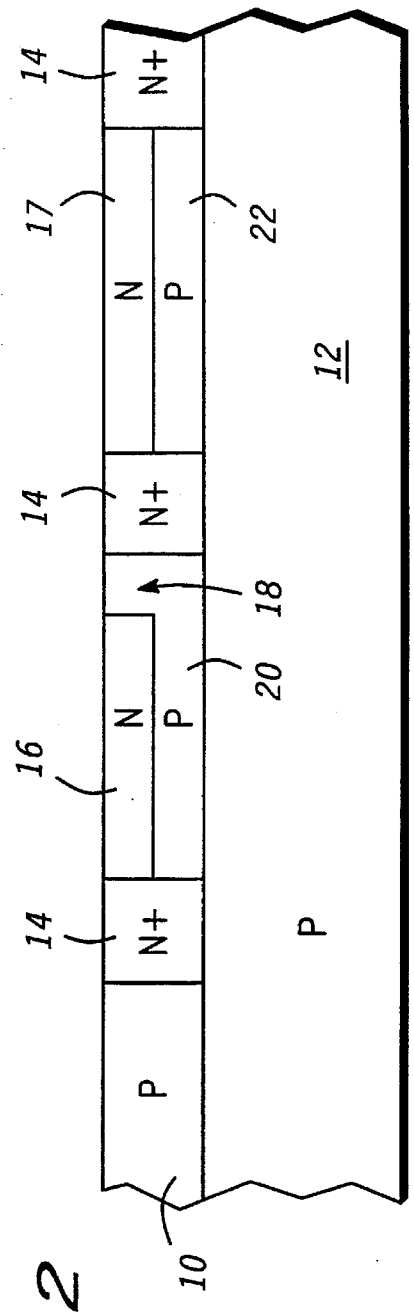

FIG. 2 illustrates a further stage in the fabrication of the structure shown in FIG. 1. Reference numbers from FIG. 1 are used for common elements. N-type buried doped regions 16 and 17 are formed in p-type buried layer 10, for example, by ion implantation of arsenic (for example, of about $1 \times 10^{14}$ atoms/cm$^2$ at 150 KeV) to achieve a moderate doping. Although doped regions 16 and 17 are described herein as being formed using only an n-type dopant for purposes of illustration, it is preferable that doped regions 16 and 17 be formed by the use of both an n-type and a p-type dopant as described further by Reuss et al. in U.S. Pat. No. 5,268,312, cited above. Doped regions 16 and 17 are formed to be substantially in contact with isolation regions 14.

According to the present invention, doped region 16 is sized appropriately to provide a gap 18. Thus, it is necessary that doped region 16 not fully cover p-type region 20 of buried layer 10 so as to later provide a partially-isolated p-well 28 (shown in FIG. 3) according to the present invention, following further processing. It should be noted that gap 18 is substantially filled with p-type material and substantially excludes n-type material. Also, it should be noted that p-type region 22 of p-type buried layer 10 is fully covered by doped region 17, which will later provide a fully-isolated p-well 30 (also shown in FIG. 3).

Figure 3:
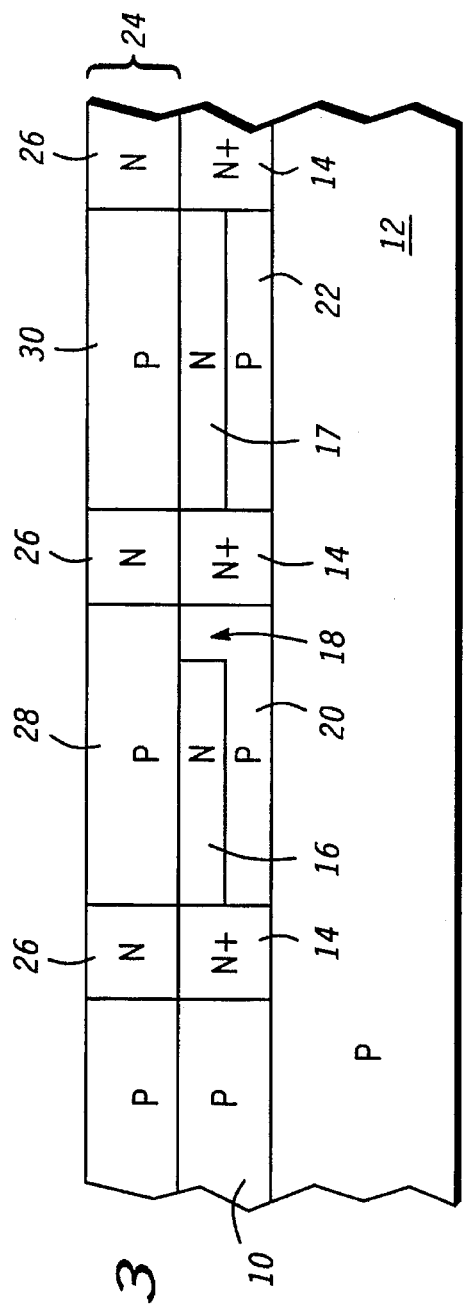

FIG. 3 illustrates a still further stage in the fabrication of the structure shown in FIG. 2. Reference numbers from previous figures are used for common elements. A semiconductor layer 24 is formed on the surface of substrate 12 and overlying buried layer 10, isolation regions 14, and doped regions 16 and 17. Semiconductor layer 24 is preferably an epitaxial layer and may be, for example, formed as a lightly-doped layer having a p-type dopant concentration of about $5 \times 10^{15}$ atoms/cm$^3$ and having a thickness of about 1 micron. Annular n-type isolation regions 26 have been formed in semiconductor layer 24 and may be formed by ion implantation of phosphorous (for example, of about $1 \times 10^{12}$ to $6 \times 10^{12}$ atoms/cm$^2$ at 180 KeV). Isolation regions 26 are formed overlying and substantially in contact with buried isolation regions 14.

Following the above processing, there is provided partially isolated p-well 28 and fully isolated p-well 30. P-well 30 is fully surrounded and electrically isolated from substrate 12 by a continuous plurality of n-type regions comprising one of isolation regions 26, one of buried isolation regions 14, and buried doped region 17. P-well 28 is isolated from substrate 12 by a similar continuous plurality of n-type regions. However, for p-well 28 the continuous plurality of n-type regions comprises gap 18, which provides an electrical connection between p-well 28 and substrate 12. This is in contrast to p-well 30 which is fully electrically isolated from substrate 12.

The dopant concentration of p-wells 28 and 30 is increased to its final level following the formation of semiconductor layer 24 by an additional step of, for example, ion implantation of boron (of about $5 \times 10^{12}$ to $1 \times 10^{13}$ atoms/cm$^2$ at 50 KeV) into those areas not occupied by isolation regions 26. P-wells 28 and 30 are preferably formed to be self-aligned with isolation regions 26 using substantially the same technique to self-align the p-type regions of buried layer 10 with isolation regions 14, as discussed above.

Also, although semiconductor layer 24 was presented above as initially being p-type, in an alternative embodiment, semiconductor layer 24 could be formed as an n-type epitaxial layer. In this alternative embodiment, p-wells 28 and 30 would be formed by appropriately doping semiconductor layer 24 with a p-type dopant.

Figure 4:
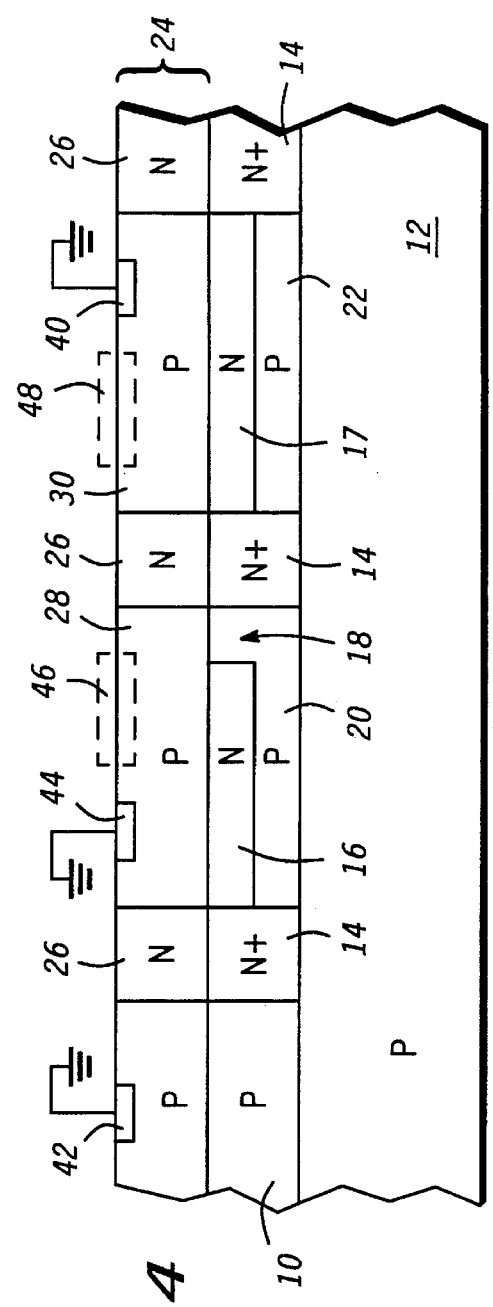

FIG. 4 illustrates a final stage in the fabrication of the structure shown in FIG. 3. Reference numbers from previous figures are used for common elements. A contact region 40 is required in fully-isolated p-well 30 to provide a contact (not shown) for tying p-well 30 to, for example, a ground potential. In contrast, and according to the present invention, p-well 28 is electrically connected to substrate 12 by gap 18, which consists of a substantially continuous region of p-type material connecting p-well 28 and substrate 12. Thus, an internal contact is not required for p-well 28. A contact region 42 is disposed outside of p-well 28 and is used for a contact (not shown) to tie substrate 12 to, for example, a ground potential. As a result, p-well 28 is electrically connected to contact region 42, and thus tied to the ground potential, by a p-type electrical path through gap 18, substrate 12, and semiconductor layer 24. Each of annular isolation regions 26 is similarly tied to a high positive potential using a contact region and contact (not shown).

Although an internal contact is not required for p-well 28, a contact region 44 may be provided therein for an internal contact (not shown). This may be done for those cases where an improved low-resistance contact to partially-isolated p-well 28 is desired, or to reduce cross-talk, which may be coupled through the substrate.

Passive and active semiconductor elements may be formed in dashed box 46 of p-well 28 or dashed box 48 of p-well 30. Examples of elements that may be formed in partially-isolated p-wells 28 and/or 30 include NMOS devices, vertical PNP devices, lateral NPN devices, capacitors, inductors, and diodes.

It has been found that the use of partially-isolated p-well 28 significantly reduces cross-talk at higher frequencies relative to the reduction in cross-talk attainable with the use of only fully-isolated wells. For example, for cross-talk signal components having a frequency greater than about 50 MHz, it has been found that the use of a partially-isolated well provides superior performance to that of a fully-isolated well. As a specific example, for a cross-talk frequency of about 200 MHz, the use of a single partially-isolated p-well in conjunction with a fully-isolated p-well provided an improvement in cross-talk suppression of 15 dB compared to the use of two fully-isolated p-wells in the absence of a partially-isolated well. Although a specific frequency range has been described above, one of skill in the art will appreciate that the frequency range over which the partially-isolated well is superior depends upon a number of factors including substrate doping and geometric factors such as gap size and the width of annular isolation regions 26.

It has also been found that cross-talk is effectively reduced where at least one of a noise-generating or a noise-sensitive element are placed within a partially-isolated well. It is not necessary that each of the noise-generating and noise-sensitive elements be placed within a partially-isolated well. It is sufficient, for example, that the noise-generating element be placed within a partially-isolated well and the noise-sensitive element be placed within a fully-isolated well. A converse placement is also effective. Also, if desired in certain cases, both noise-source and noise-generating elements may be placed exclusively within partially-isolated wells (in other words, fully-isolated wells are not used in the layout). It has been found though that cross-talk suppression between elements in two wells is most effective when using a partially-isolated well in conjuction with a fully-isolated well.

With respect to gap 18 itself, in general it may be placed anywhere along the perimeter formed by the continuous plurality of n-type regions surrounding p-well 28. Preferably, gap 18 is disposed in p-type region 20 and may be placed either near an edge of region 20 or anywhere in the middle extent thereof. However, it has been found to be most advantageous to place gap 18 near the edge of p-type region 20 that is most proximate to a partially-isolated well containing a noise-sensitive element. For example, referring to FIG. 4, gap 18 is shown positioned proximate to p-well 30, which is preferred when p-well 30 contains a noise-sensitive element.

The reason for positioning gap 18 proximate to p-well 30 as described above is related to noise current flow away from p-well 28. Although DC noise currents are blocked by the reverse-biased junction between doped region 16 and p-well 28, AC noise currents still capacitively couple into doped region 16 during operation. These AC currents generally flow from a noise-generating element in p-well 28 to a high potential contact (not shown) used to bias isolation regions 26. It is believed that the placement of gap 18 in a position proximate to p-well 30 is preferred because this location of gap 18 forces most of the coupled AC noise currents to flow through doped region 16 in a direction away from p-well 30. Because most of the AC noise current flows away, cross-talk in p-well 30 is reduced.

The size of gap 18 is preferably defined to have a width about equal to the minimum value attainable with the particular processing technology used for fabrication. As the size of gap 18 is increased beyond a certain point, cross-talk suppression will start to decline because AC currents are no longer efficiently collected and thus prevented from being coupled into substrate 12. Thus, in selecting a size for gap 18, a gap should be selected to be small enough so a device in p-well 28 is substantially shielded underneath its full extent and such that AC current is unlikely to spread beyond buried doped region 16. However, each gap must be made sufficiently large so as to provide an electrical connection between p-well 28 and substrate 12.

Often, gap 18 will have a rectangular layout shape, with maximum and minimum orthogonal dimensions. However, other shapes may be used as will be appreciated by one of skill in the art. For the purposes of this application, the size of gap 18 may be characterized by its minor dimension. A gap's minor dimension is generally its smallest dimension. The minor dimension is defined herein for some standard geometrical shapes as follows: for a rectangle, it is the length of the minimum dimension or shorter side; for a circle, it is the diameter; and for an ellipse, it is the length of the minor axis. One skilled in the art will recognize that other, non-standard shapes may also be used.

In addition, it is possible to use more than one gap. The foregoing discussion is substantially applicable to such use except that the sum of the combined widths of the gaps are to be limited as for the single gap width described above. As a specific example, when using either one or more gaps, the sum of the minor dimensions of each gap within a common p-well is preferably less than, for example, about 3 microns, and more preferably less than about 1 micron.

Although a particular embodiment has been described above, other variations will be apparent to one of skill in the art. For example, although the embodiment presented above includes semiconductor layer 24, it should be appreciated that in other embodiments layer 24 would not be necessary. In the absence of semiconductor layer 24, p-well 28 would be formed directly in substrate 12 and surrounded by a continuous plurality of n-type regions (14, 16, 26), except for gap 18.

By now, it should be appreciated that there has been provided a novel isolation structure for an integrated circuit. This isolation structure provides improved reduction in cross-talk between noise-generating devices and noise-sensitive devices at higher frequencies. Further, it does not require an internal contact for each well, as is required by prior, fully-isolated wells.

We claim:

1. An isolation structure for a semiconductor device comprising:

a semiconductor substrate of a first conductivity type;

a first well of said first conductivity type disposed in said semiconductor substrate;

a first continuous plurality of regions of a second conductivity type disposed around said first well, wherein said first continuous plurality of regions fully isolates said first well from said semiconductor substrate, except that said first continuous plurality of regions comprises at least one gap of said first conductivity type that physically connects said first well and said semiconductor substrate through said first continuous plurality of regions; and wherein each of said gaps has a minor dimension and a sum of the minor dimensions of said gaps is less than about 3 microns.

2. The structure of claim 1 wherein an epitaxial layer of said first conductivity type is disposed on said semiconductor substrate and at least a portion of said first well is disposed in said epitaxial layer.

3. The structure of claim 1 wherein said first continuous plurality of regions includes only a single gap.

4. The structure of claim 1 wherein each of said gaps has a minor dimension and a sum of the minor dimensions of said gaps is less than about 1 micron.

5. The structure of claim 1 wherein said semiconductor substrate transmits a cross-talk component having a frequency greater than about 50 MHz.

6. The structure of claim 1 wherein said first well is biased solely by a contact region disposed outside said first well.

7. The structure of claim 1 wherein each of said gaps is disposed in a portion of a buried layer of said first conductivity type.

8. The structure of claim 1 wherein said first continuous plurality of regions comprises a buried doped region of said second conductivity type and each of said gaps is an opening in said buried doped region.

9. The structure of claim 1 further comprising:

a second well of said first conductivity type disposed in said semiconductor substrate; and a second continuous plurality of regions of said second conductivity type disposed around said second well, wherein said second continuous plurality of regions fully isolates said second well from said semiconductor substrate.

10. The structure of claim 9 wherein said second well includes a device that electrically couples to cross-talk frequencies greater than about 50 MHz and each of said gaps is disposed proximate to said second well.

11. An isolation structure for a semiconductor device comprising:

a semiconductor substrate of a first conductivity type;

an epitaxial layer of said first conductivity type disposed on said semiconductor substrate;

a first well of said first conductivity type disposed in said epitaxial layer;

an isolation region of a second conductivity type disposed in said epitaxial layer and outside said first well;

a buried isolation region of said second conductivity type disposed in said semiconductor substrate underneath and in contact with said isolation region;

a buried doped region of said second conductivity type disposed in said semiconductor substrate and underneath said first well, wherein said buried doped region is in contact with said buried isolation region so that said first well is fully isolated from said semiconductor substrate, except that said buried doped region comprises at least one gap of said first conductivity type that connects said first well and said semiconductor substrate; and wherein each of said gaps has a minor dimension and a sum of the minor dimensions of said gaps is less than about 3 microns.

12. The structure of claim 11 wherein each of said gaps is disposed in a buried layer of said first conductivity type.

13. The structure of claim 11 wherein each of said gaps has a minor dimension and a sum of the minor dimensions of said gaps is less than about 1 micron.

14. The structure of claim 11 wherein said semiconductor substrate transmits a cross-talk component having a frequency greater than about 50 MHz.

15. The structure of claim 11 further comprising a second well of said first conductivity type disposed in said epitaxial layer, wherein said second well is fully isolated from said semiconductor substrate.

16. The structure of claim 15 wherein said second well includes a device that electrically couples to cross-talk frequencies greater than about 50 MHz and each of said gaps is disposed proximate to said second well.

17. The structure of claim 11 wherein said first conductivity type is p-type.

* * * * *